United States Patent
Lin et al.

(10) Patent No.: US 7,363,964 B2
(45) Date of Patent: Apr. 29, 2008

(54) HEAT SINK

(75) Inventors: Shu-Ju Lin, Taipei (TW); Li-Tai Liu, Taipei (TW)

(73) Assignee: Inventec Corporation (TW)

( * ) Notice: Subject to any disclaimer, the term of this patent is extended or adjusted under 35 U.S.C. 154(b) by 70 days.

(21) Appl. No.: 11/395,844

(22) Filed: Mar. 30, 2006

(65) Prior Publication Data

US 2007/0074852 A1   Apr. 5, 2007

(30) Foreign Application Priority Data

Oct. 5, 2005   (TW) .............................. 94217204 U

(51) Int. Cl.
*F28F 7/00* (2006.01)
(52) U.S. Cl. .................. 165/80.3; 165/81; 361/704
(58) Field of Classification Search ............... 165/80.3, 165/80.2, 81; 361/704
See application file for complete search history.

(56) References Cited

U.S. PATENT DOCUMENTS

| | | | | |
|---|---|---|---|---|
| 4,535,384 A | * | 8/1985 | Wakabayashi et al. | 165/80.3 |
| 6,260,612 B1 | * | 7/2001 | Nakamura et al. | 165/82 |
| 6,536,509 B1 | * | 3/2003 | Koidl et al. | 165/185 |
| 7,085,135 B2 | * | 8/2006 | Chu et al. | 165/80.3 |
| 2003/0001248 A1 | * | 1/2003 | Alcoe et al. | 257/678 |
| 2006/0169437 A1 | * | 8/2006 | Yano et al. | 165/80.3 |

* cited by examiner

*Primary Examiner*—Teresa J. Walberg
(74) *Attorney, Agent, or Firm*—Peter F. Corless; Steven M. Jensen; Edwards Angell Palmer & Dodge LLP

(57) ABSTRACT

A heat sink includes a base, a set of fins mounted to the base and a plurality of fixing portions, wherein the fixing portions extend from a surface of the base and the set of fins are mounted on an opposite surface of the base. The heat sink is secured to a printed circuit board with at least one heat generating component through the fixing portion of the base. The heat sink is improved by forming one or more slots at lateral sides of the base such that one or more deformable portions can be defined on the base. Thus, the deformable length of the base is increased and the heat stress is relaxed.

8 Claims, 4 Drawing Sheets

HEAT SINK

FIELD OF THE INVENTION

The present invention relates to a heat sink, and more particularly, to a heat sink for dissipating heat generated from a heat generating component which is in contact with the heat sink.

BACKGROUND OF THE INVENTION

It is well known that heat generating components in a computer such as central processing units, microprocessors or chipsets generate a large amount of heat during the computer operates. As the generated heat increases above a critical temperature, a failure can occur in the heat generating components. Therefore, the excess heat must be dissipated to prevent such failures.

Since a chipset is responsible for data transferring between primary chips and peripheral I/O components, it is particularly important to dissipate heat generated by the chipset. Usually, the chipset is in close contact with a heat sink for efficient heat dissipation. Such a heat sink is shown in FIG. 4 and FIG. 5.

As shown in FIG. 4, the heat sink includes a base 10 with a set of fins mounted thereon, and a plurality of fixing portions 20 disposed at lateral sides of the base 10. The base 10 is made of aluminum and the fixing portions 20 can be made of iron or aluminum alloy. As shown in FIG. 5, the heat sink is disposed on a printed circuit board 50 with the base 10 of the heat sink being in direct contact with the heat generating component 30 such as a chipset and fixing portions 20 of the heat sink being passed through the printed circuit board 50. By soldering solder balls (not shown) on the fixing portions 20 and the printed circuit board 50, soldering portions 40 are formed to fix the heat sink to the printed circuit board 50.

However, since the heat sink is made of different materials with different coefficients of thermal expansion, the heat stress is introduced which can cause such problems as cracks of the soldering portions 40 and deformations of the printed circuit board 50, thereby decreasing reliability of products.

Accordingly, there is a need to develop a heat sink which can efficiently decrease the heat stress.

SUMMARY OF THE INVENTION

According to the above defects, an objective of the present invention is to provide a heat sink which can efficiently decrease the heat stress.

Another objective of the present invention is to provide a heat sink which can increase reliability of products.

To achieve the above and other objectives, the heat sink of the present invention comprises a base, a set of fins mounted to the base and at least a fixing portion, wherein the heat sink is secured to a printed circuit board with at least one heat generating component through the fixing portion of the base, and further formed with at least a slot at a lateral side of the base such that at least a deformable portion can be defined on the base. However, it should be understood that the location, amount and distribution of the fixing portion, slot and deformable portion may vary and are not limited to that described and illustrated. For instance, the heat sink may comprise a plurality of the fixing portions, slots and deformable portions.

Preferably, the slots are in rectangular shape. The fixing portion is disposed at a corner of the base of the heat sink and preferably, the heat sink comprises two fixing portions. The fixing portion can be disposed on the deform able portions of the base. The deformable portions can be rectangular-shaped blocks. Preferably, the heat sink has two deformable portions. The heat sink has a contact region for interfacing with a heat generating component such as a chipset. The contact region can be rectangular-shaped corresponding to the heat generating component. Further, a soldering portion can be formed on the heat sink.

Compared with the prior art, the deformable portions disposed on the base of the heat sink can increase the deformable length of the base such that the heat stress can be efficiently decreased, thereby avoiding such problems as cracks of the soldering portions and deformations of the printed circuit board in the prior art and accordingly increasing product reliability.

DETAILED DESCRIPTION OF PREFERRED EMBODIMENTS

Hereunder, embodiments of the present invention will be described in full detail with reference to the accompanying drawings.

Figure 1:
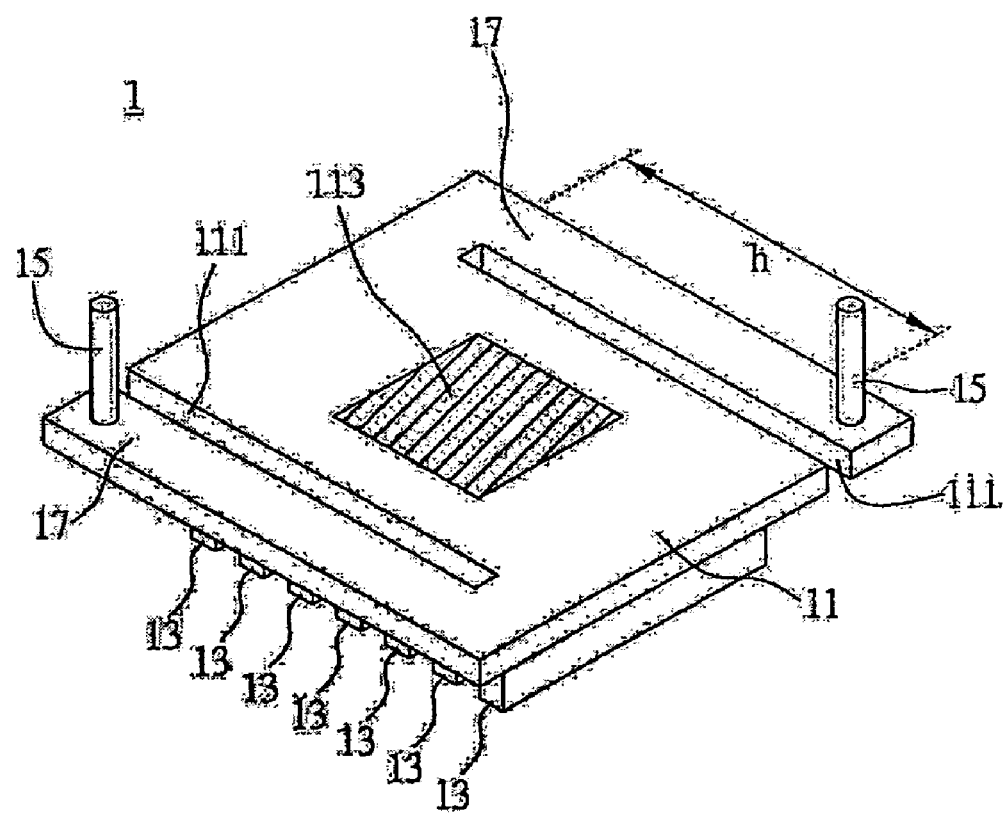
FIG. 1 is structural diagram of a heat sink according to a preferred embodiment of the present invention.
Figure 2:
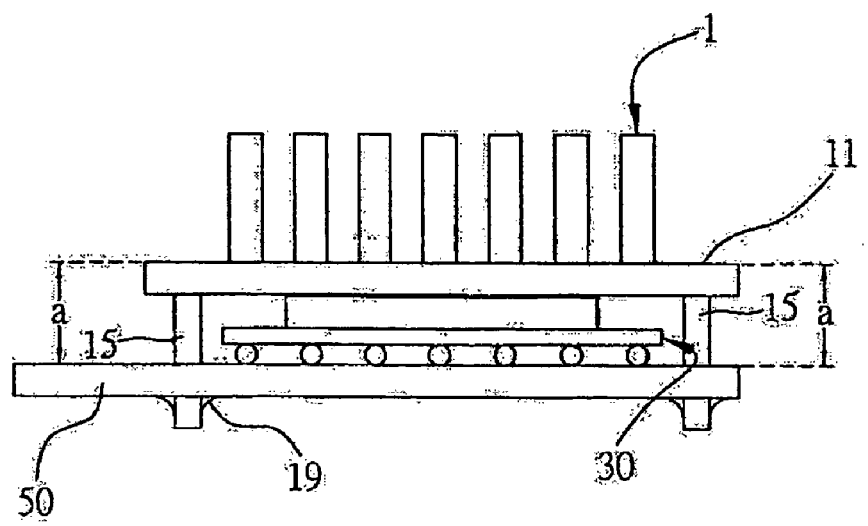
FIG. 2 is a diagram of a heat sink in use at normal temperature.
Figure 3:
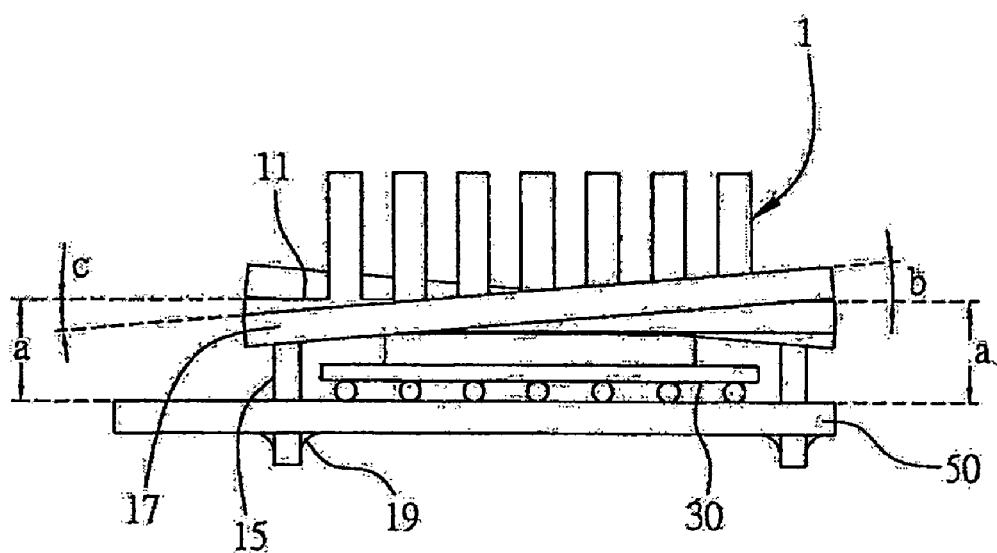
FIG. 3 is a diagram of a heat sink in use at high temperature.
Figure 4:
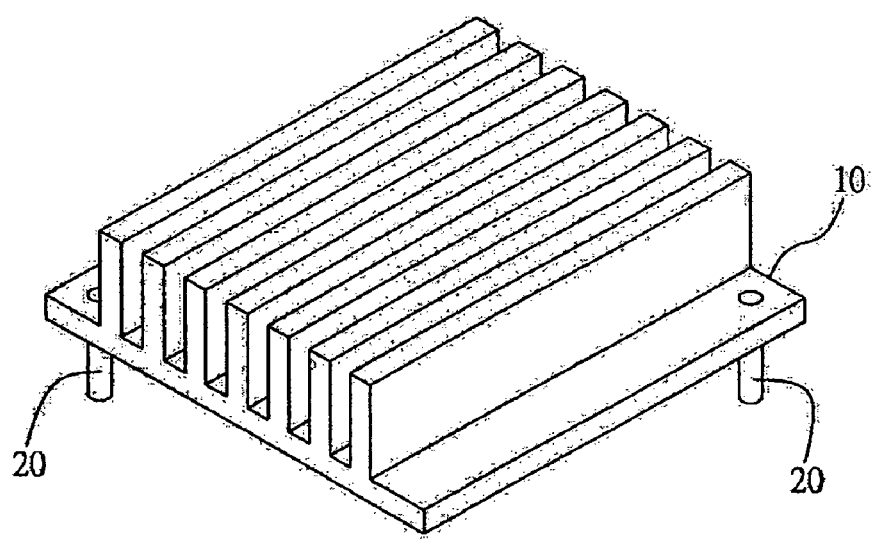
FIG. 4 is a structural diagram of a heat sink of the prior art.
Figure 5:
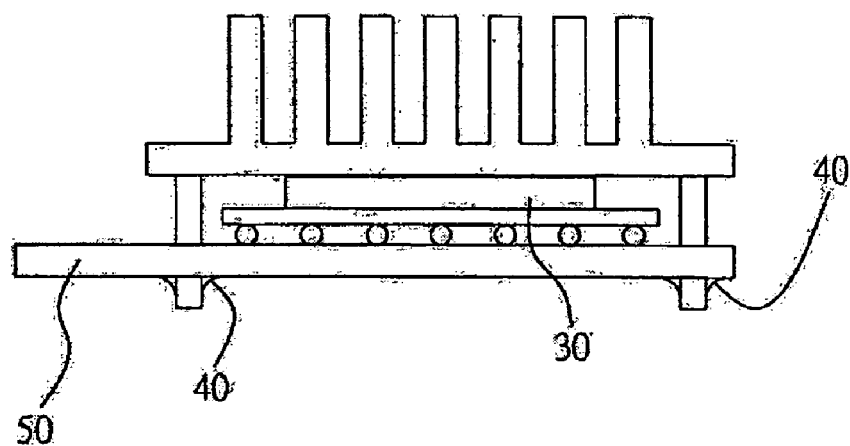
FIG. 5 is a diagram of a heat sink of the prior art in use at normal temperature.

FIGS. 1 to 3 are diagrams of the heat sink according to a preferred embodiment of the present invention. The heat sink of the present invention can be directly attached to a heat generating component, such as a chipset, a central processing unit, a micro processing unit and so on. In the present embodiment, the heat generating component is a chipset.

Referring to FIG. 1, the heat sink 1 comprises a base 1, a set of fins 13 attached to a surface of the base 11 and a plurality of fixing portion 15 extending from the opposite surface of the base 1. The heat sink 1 is improved by forming a plurality of slots 111 at lateral sides of the base 11 such that a plurality of deformable portions 17 can be defined on the base 11 so as to increase the deformable length of the base 11, thereby relaxing the heat stress.

The base 11 is a substantially rectangular-shaped conductive block, which can be made of aluminum, for example. A rectangular contact region 113 is formed in the center of the base 11 for directly contacting a chipset. The slots 111 formed at the lateral sides of the base 11 can also be in the shape of rectangular and the length of the slots 111 is denoted as h, for example.

It should be noted that the shape of the base 11, the slots 111 and the contact region 113 is not limited to the present embodiment. For example, the slots 111 can be of any other regular or irregular shape. Similarly, the length of the slots 111 is not limited to h as shown in FIG. 1.

In the present embodiment, the fins 13 of sheet shape are spaced apart on the surface of the base 11, which are used to increase the surface area such that heat generated from the heat generating component can be dissipated quickly. It should be noted that the shape, number and arranging structure of the fins 13 can be modified in practical implementation. In addition, the base 11 and the fins 13 can be made of other materials instead of aluminum.

The fixing portions 15 are respectively disposed at two corners of the base 11 and fixed to a printed circuit board with the heat generating component mounted thereon. The fixing portions 15 are used for supporting the base 11 such that the base 111 can be located over and directly contacted with the heat generating component such as a chipset. The number and position of the fixing portions 15 are not limited to the present embodiment. Meanwhile, the fixing portions 15 can be of cylindrical shape and made from iron or aluminum alloy.

The deformable portions 17 of rectangular shape are disposed at two sides of the base 11. The fixing portions 15 are disposed on the deformable portions 17.

Referring to FIG. 2, by soldering solder balls on the fixing portions 15 and the printed circuit board 50, soldering portions 19 are formed to fix the fixing portions 15 to the printed circuit board 50. Meanwhile, the base 11 is in direct contact with the heat generating component 30 such that heat generated from the heat generating component 30 during operation can be dissipated efficiently.

In addition, the distance from both sides of the base 11 to the printed circuit board 50 is same and denoted as a.

Referring to FIG. 3, in operation, the heat generating component 30 such as a chipset generates a lot of heat. The heat increases the temperature on the surface of the heat generating component 30, thereby causing the deformable portions 17 of the case 11 to deform. From the view direction of FIG. 3, the distance between the right side of the base 11 and the printed circuit board 50 changes from a to a+b while the distance between the left side of the base 11 and the printed circuit board 50 changes from a to a−c, wherein, b is bigger than c. Meanwhile, the base 11 is still in contact with the heat generating component 30 and, the soldering portions 19 and the printed circuit board 50 are not changed.

Therefore, since the deformable portions 17 increase the deformable length of the base 11, that is, the deformable distance between the base 11 and the printed circuit board 50 increases. Accordingly, the heat stress caused from different coefficients of thermal expansion of different materials is decreased, thereby protecting the soldering portions and the printed circuit board from being damaged by the heat stress. As a result, the product reliability is increased.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A heat sink comprising a base, a pair of slots, a set of fins mounted to the base, and a pair of fixing portions respectively disposed at diagonal corners of the base, wherein the heat sink is secured to a printed circuit board having at least one heat generating component through the fixing portions, and each of the slots has two ends with one end open to a lateral side of the base while the other end remains connected with the base, each of the open ends being adjacent to one of the corresponding fixing portions such that at least one deformable portion is defined on the base so as to increase a deformable length of the base, thereby relaxing heat stress.

2. The heat sink of claim 1, wherein the slots are rectangular-shaped.

3. The heat sink of claim 1, wherein the fixing portions are disposed on the deformable portion of the base.

4. The heat sink of claim 1, wherein the deformable portion is rectangular-shaped block.

5. The heat sink of claim 1, wherein the heat sink comprises two deformable portions.

6. The heat sink of claim 1, wherein the base has a contact region for interfacing with the heat generating component.

7. The heat sink of claim 6, wherein the contact region is rectangular-shaped.

8. The heat sink of claim 1, wherein the heat sink further comprises a soldering portion.

* * * * *